(12) United States Patent
Otto et al.

(10) Patent No.: US 11,387,070 B2
(45) Date of Patent: Jul. 12, 2022

(54) ROBUST AND PRECISE SYNCHRONIZATION OF MICROWAVE OSCILLATORS TO A LASER OSCILLATOR IN PULSED ELECTRON BEAM DEVICES

(71) Applicant: THE ROYAL INSTITUTION FOR THE ADVANCEMENT OF LEARNING/MCGILL UNIVERSITY, Montréal (CA)

(72) Inventors: Martin Otto, Montreal (CA); Bradley Siwick, Town of Mount Royal (CA)

(73) Assignee: THE ROYAL INSTITUTION FOR THE ADVANCEMENT OF LEARNING/MCGILL UNIVERSITY, Montreal (CA)

( * ) Notice: Subject to any disclaimer, the term of this patent is extended or adjusted under 35 U.S.C. 154(b) by 208 days.

(21) Appl. No.: 16/526,462

(22) Filed: Jul. 30, 2019

(65) Prior Publication Data
US 2020/0035442 A1    Jan. 30, 2020

Related U.S. Application Data

(60) Provisional application No. 62/711,660, filed on Jul. 30, 2018.

(51) Int. Cl.
*H01J 37/06* (2006.01)
*H01S 3/16* (2006.01)
(Continued)

(52) U.S. Cl.
CPC ............... *H01J 37/06* (2013.01); *G21K 1/06* (2013.01); *H01S 3/1106* (2013.01);
(Continued)

(58) Field of Classification Search
CPC .... H01J 37/06; H01J 37/26; H01J 2237/0473; H01J 2237/06333; H01J 37/04; H01J 2237/26; H01J 2237/04737; H01S 3/1625; H01S 3/1636; H01S 3/1106; H05H 7/02; H05H 2007/022; H05H 2007/025; H03F 2200/294; H03B 2200/0074; H03B 2200/0044; H03B 17/00
(Continued)

(56) References Cited

U.S. PATENT DOCUMENTS 9,653,877 B1 *   5/2017   Arissian ................ H01S 3/1112
2005/0254535 A1 * 11/2005   Loewen .................... G21K 1/06
                                                             372/32

FOREIGN PATENT DOCUMENTS

EP      0414194 A2 *   2/1991   ........... H01S 3/1392
WO   WO-9717637 A1 *   5/1997   ............... H03L 7/26
WO      2017196434 A1  11/2017

* cited by examiner

*Primary Examiner* — Arnold M Kinkead
(74) *Attorney, Agent, or Firm* — Norton Rose Fulbright Canada LLP; Alexandre Daoust; Reno Lessard

(57) ABSTRACT

There is described a device for generating electromagnetic field oscillation in a RF device or cavity. The device generally has a photo-diode configured for receiving a laser pulse train and emitting a first electrical signal based thereon, the first electrical signal having a plurality of frequencies; and a harmonics selector configured to output a second electrical signal having one or more frequency of the first electrical signal, the one or more frequency being selected in a manner for the output to generate the electromagnetic field oscillation in the RF device or cavity.

20 Claims, 8 Drawing Sheets

(51) Int. Cl.
  *H01S 3/11*   (2006.01)
  *H05H 7/02*   (2006.01)
  *H03B 17/00*  (2006.01)
  *H03F 3/21*   (2006.01)
  *G21K 1/06*   (2006.01)
  *H01J 37/26*  (2006.01)

(52) U.S. Cl.
  CPC .......... *H01S 3/1625* (2013.01); *H01S 3/1636* (2013.01); *H03B 17/00* (2013.01); *H03F 3/21* (2013.01); *H05H 7/02* (2013.01); *H01J 37/26* (2013.01); *H01J 2237/0473* (2013.01); *H03B 2200/0044* (2013.01); *H03B 2200/0074* (2013.01); *H03F 2200/294* (2013.01); *H05H 2007/022* (2013.01); *H05H 2007/025* (2013.01)

(58) Field of Classification Search
  USPC ............... 372/32; 250/287, 397; 331/3, 94.1
  See application file for complete search history.

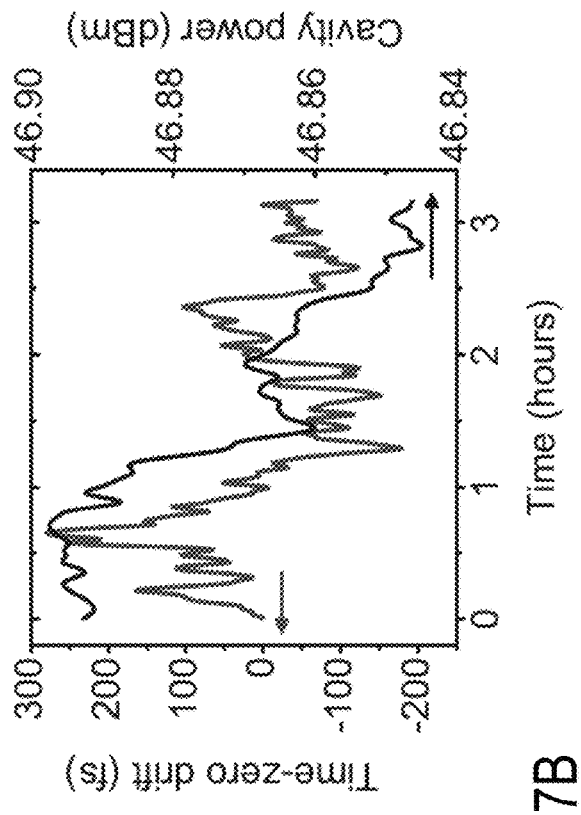
Fig. 7A
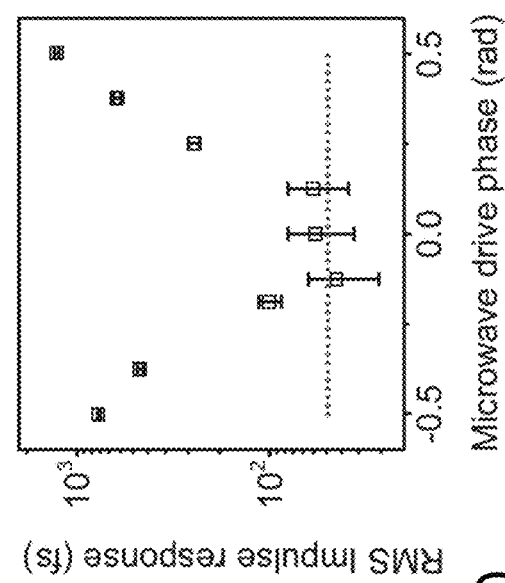
Fig. 7B
Fig. 7C
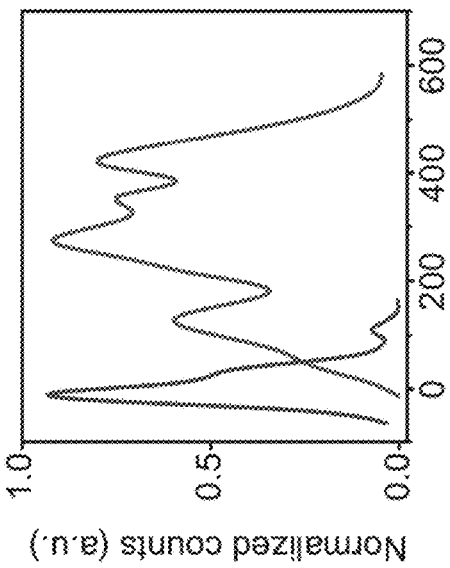
Fig. 7D

ROBUST AND PRECISE SYNCHRONIZATION OF MICROWAVE OSCILLATORS TO A LASER OSCILLATOR IN PULSED ELECTRON BEAM DEVICES

FIELD

The improvements generally relate to the synchronization of a radio frequency (RF) device or cavity to a laser pulse generator and more specifically to pulsed electron beam devices including such RF device or cavity.

BACKGROUND

Electron microscopy, scattering and spectroscopy instruments (hereinafter collectively referred to as "electron microscopy instruments") generally use accelerated electrons as a source of illumination. An example of a pulsed (or time-resolved) electron microscopy system is described in International Patent Application Publication No. WO 2017/196434 A1. In this publication, there is described an electron microscope instrument having an electron emitter, a RF device or cavity and multiple electron lenses in which the lenses are used in an aligned manner to deflect and focus electrons emitted by the electron emitter. Although existing pulsed electron microscopy instruments are satisfactory to a certain degree, there remains room for improvement.

SUMMARY

In such systems, pulsed electron emission typically results from photoemission by directing a pulsed laser beam at a photocathode. Typically, a bunch of electrons is emitted after an optical pulse reaches the photocathode. The repetition rate at which bunches of electrons are emitted thus depends on the repetition rate at which the optical pulses reach the photocathode. In these systems, it has been noticed that both intrinsic quantum mechanical effects and Coulomb repulsion (space-charge) internal to the photo emitted bunch of electrons take hold, broadening both the temporal duration and energy distribution of the photo emitted bunch of electrons.

To address at least some of the challenges associated with pulsed electron beams, the emitted electrons can be manipulated with both static and time-varying electromagnetic fields. Strong, time-varying electromagnetic fields can be generated inside a RF device or cavity with a phase and amplitude that is adjustable through the properties of the drive signal used to excite the cavity. Therefore, such cavities are known to be useful in the manipulation of electron bunches, particularly at the relativistic energies used in research-grade particle accelerators, synchrotrons and free electron lasers. As at least some existing pulsed electron microscopy instruments operating at lower energies also use radio frequency cavities. The signal used to drive the RF device or cavity can be generated in a standalone manner in some embodiments whereas it can be generated indirectly based on a laser beam using a voltage controlled oscillator in a phase-locked loop ("PLL") design in some other embodiments.

There remains a need in the industry for accurately tuning the frequency (and phase) of the radio frequency signal used to drive the cavity so that electrons can be manipulated in a reproducible and robust manner over a very broad range of times; from the time between electron pulses (such as 1 ns) out to the time required to complete an entire measurement (as long as several days).

The inventors have developed an approach that stabilizes the operation of radio frequency cavities on pulsed electron beams. In one aspect, the inventors suggest generating the radio frequency signal used to drive the cavity directly from the pulsed laser beam used to generate the electron pulses themselves. More specifically, there is described an instrument having a locking device configured for receiving a signal produced by at least a portion of the laser pulse train also used to emit electrons. This laser pulse train is used to generate a radio frequency signal which is phase-locked to the laser, and subsequently drives the RF device or cavity. In this instrument, the RF device or cavity is configured for generating an electric or magnetic field inside the cavity based on the radio frequency signal originating from the laser beam, thereby modifying (e.g., defocusing, collimating, focusing, deflection) the emitted electrons.

In accordance with a first aspect of the present disclosure, there is provided an electron spectroscopy instrument comprising: a pulsed laser source configured for generating a laser beam; an electron emitter configured for interacting with at least a portion of the laser beam and for emitting electrons along an electron propagation axis in response to said interacting; a locking device configured for receiving at least a portion of the laser beam and to generate a radio frequency signal which is locked on a higher-order harmonic of the laser beam; and a RF device or cavity across which the electron propagation axis extends, the RF device or cavity being configured for generating an electric field inside the RF device or cavity based on the radio frequency signal.

Further in accordance with the first aspect of the present disclosure, the electron spectroscopy instrument has for example a sample receiving area downstream from said RF device or cavity and across which the electron propagation axis extends.

Still further in accordance with the first aspect of the present disclosure, the electron spectroscopy instrument has for example an electron detection device for receiving electrons from the sample receiving area.

Still further in accordance with the first aspect of the present disclosure, the pulsed laser source is for example a pulsed laser source.

Still further in accordance with the first aspect of the present disclosure, the pulsed laser source is for example a mode-locked Ti:Sapphire oscillator.

Still further in accordance with the first aspect of the present disclosure, the Ti:Sapphire oscillator has for example a fundamental repetition rate of $f_{rep} \cong 74.98$ MHz.

Still further in accordance with the first aspect of the present disclosure, the electron spectroscopy instrument has for example a fast photodiode with a bandwidth of about 12.5 GHz to sample the portion of the pulsed laser beam and provide a sampled signal, a first band-pass filter to select the higher-order harmonic in the sampled signal and provide a first filtered signal, an ultra-low phase noise narrow band amplifier providing about roughly 30 dB of gain to amplify the first filtered signal and provide an amplified signal, and a second band-pass filter centered at 2.9985 GHz with a bandwidth of 50 MHz to further isolate the higher-order harmonic in the amplified signal.

Still further in accordance with the first aspect of the present disclosure, the higher-order harmonic of the laser beam ranges for example between a $20^{th}$ harmonic and a $60^{th}$ harmonic of the laser beam.

Still further in accordance with the first aspect of the present disclosure, the higher-order harmonic of the laser beam ranges for example between a $30^{th}$ and a $50^{th}$ harmonic of the laser beam.

Still further in accordance with the first aspect of the present disclosure, the higher-order harmonic of the laser beam is for example a $40^{th}$ harmonic of the laser beam.

Still further in accordance with the first aspect of the present disclosure, the RF device or cavity is for example configured to at least one of temporally defocus, temporally collimate and temporally focus electrons propagated along the electron propagation axis.

In accordance with a second aspect of the present disclosure, there is provided a method of performing electron spectroscopy comprising: emitting electrons along an electron propagation axis by interacting a laser beam with an electron emitter; generating a radio frequency signal by isolating a higher-order harmonic of the laser beam used in said emitting; propagating the electrons across a RF device or cavity while generating an electric field in the cavity using said radio frequency signal, thereby modifying the electrons propagating thereacross; and interrogating a sample using said modified electrons.

Further in accordance with the second aspect of the present disclosure, the step of modifying includes for example at least one of temporally defocusing, temporally collimating and temporally focusing electrons propagated along the electron propagation axis.

In accordance with a third aspect of the present disclosure, there is provided a device for generating electromagnetic field oscillation in a RF device or cavity, the device comprising: a photo-diode configured for receiving a laser pulse train and emitting a first electrical signal based thereon, the first electrical signal having a plurality of frequencies; and a harmonics selector configured to output a second electrical signal having one or more frequency of the first electrical signal, the one or more frequency being selected in a manner for the output to generate the electromagnetic field oscillation in the RF device or cavity.

Further in accordance with the third aspect of the present disclosure, the device comprising for example an amplification train configured to amplify the second electrical signal.

Still further in accordance with the third aspect of the present disclosure, the device has for example a sample receiving area downstream from said RF device or cavity and across which an electron propagation axis extends.

Still further in accordance with the third aspect of the present disclosure, the photo-diode is for example a fast photodiode with a bandwidth of about 12.5 GHz to sample a portion of the laser pulse train and provide the first electrical signal.

Still further in accordance with the third aspect of the present disclosure, the harmonics selector has for example a first band-pass filter to select a higher-order harmonic and provide the first electrical signal, an ultra-low phase noise narrow band amplifier providing about roughly 30 dB of gain to amplify the first electrical signal and provide an amplified signal, and a second band-pass filter centered at 2.9985 GHz with a bandwidth of 50 MHz to further isolate the higher-order harmonic in the amplified signal.

Still further in accordance with the third aspect of the present disclosure, the higher-order harmonic ranges for example between a $20^{th}$ harmonic and a $60^{th}$ harmonic of the laser beam.

Still further in accordance with the third aspect of the present disclosure, the higher-order harmonic ranges for example between a $30^{th}$ and a $50^{th}$ harmonic of the laser beam.

Still further in accordance with the third aspect of the present disclosure, the higher-order harmonic is for example a $40^{th}$ harmonic of the laser beam.

In accordance with a fourth aspect of the present disclosure, there is provided a system comprising: a RF device or cavity; a pulsed laser source; and a locking device configured to receive a laser pulse train from the pulsed laser source, and to convert the laser pulse train into an electrical signal having one or more frequencies configured for generating electromagnetic field oscillation in the RF device or cavity.

Further in accordance with the fourth aspect of the present disclosure, the RF device or cavity is for example part of a pulsed electron device.

Still further in accordance with the fourth aspect of the present disclosure, the system has for example a phase locking device configured to receive an output of the RF device or cavity, detect a change in the phase of the output of the RF device or cavity, and apply a phase correction to the RF device or cavity based on the detected phase change.

Still further in accordance with the fourth aspect of the present disclosure, said detecting a change includes for example comparing the output of the RF device or cavity to the output of the locking device.

Still further in accordance with the fourth aspect of the present disclosure, the system having for example an amplification train configured to amplify the second electrical signal.

Still further in accordance with the fourth aspect of the present disclosure, the system having for example a sample receiving area downstream from said RF device or cavity and across which an electron propagation axis extends.

Still further in accordance with the fourth aspect of the present disclosure, the RF device or cavity is for example configured to at least one of temporally defocus, temporally collimate and temporally focus electrons propagated along the electron propagation axis.

Still further in accordance with the fourth aspect of the present disclosure, the pulsed laser source is for example a mode-locked Ti:Sapphire oscillator.

Still further in accordance with the fourth aspect of the present disclosure, the Ti:Sapphire oscillator has for example a fundamental repetition rate of $f_{rep} \cong 74.98$ MHz.

Still further in accordance with the fourth aspect of the present disclosure, the locking device has for example a photo-diode configured for receiving the laser pulse train and emitting a first electrical signal based thereon, the first electrical signal having a plurality of frequencies; and a harmonics selector configured to output a second electrical signal having one or more frequency of the first electrical signal, the one or more frequency being selected in a manner for the output to generate the electromagnetic field oscillation in the RF device or cavity.

Still further in accordance with the fourth aspect of the present disclosure, the photo-diode is for example a fast photodiode with a bandwidth of about 12.5 GHz to sample a portion of the laser pulse train and provide the first electrical signal.

Still further in accordance with the fourth aspect of the present disclosure, the harmonics selector has for example a first band-pass filter to select a higher-order harmonic and provide the first electrical signal, an ultra-low phase noise narrow band amplifier providing about 30 dB of gain to amplify the first electrical signal and provide an amplified signal, and a second band-pass filter centered at 2.9985 GHz with a bandwidth of 50 MHz to further isolate the higher-order harmonic in the amplified signal.

Still further in accordance with the fourth aspect of the present disclosure, the higher-order harmonic ranges for example between a $20^{th}$ harmonic and a $60^{th}$ harmonic of the laser beam.

This approach involves a higher-order harmonic of the laser pulse repetition frequency to be directly obtained by photo detection, which can be intrinsically passive and immune to phase error. This approach can alleviate the drawbacks associated to existing techniques, such as those involves a voltage-controlled oscillator (VCO) and/or phase-lock loops (PLL) which suffers from amplitude-phase modulation instabilities.

For instance, shifting phase directly which can have an advantage in terms of feedback speed, i.e., the approach presented herein can correct greater than 1 kHz (the electron pulse rate; shot-to-shot) and even in principle up to ½ the 3 GHz carrier frequency in contrast with existing techniques, which are limited to the thermal response of the cavity (e.g., ~10 s). Furthermore, the approach presented herein can correct for other sources of jitter such as cable phase drift and amplifier jitter.

It will be understood that the expression "computer" as used herein is not to be interpreted in a limiting manner. It is rather used in a broad sense to generally refer to the combination of some form of one or more processing units and some form of memory system accessible by the processing unit(s). Similarly, the expression "controller" as used herein is not to be interpreted in a limiting manner but rather in a general sense of a device, or of a system having more than one device, performing the function(s) of controlling one or more device.

It will be understood that the various functions of a computer or of a controller can be performed by hardware or by a combination of both hardware and software. For example, hardware can include logic gates included as part of a silicon chip of the processor. Software can be in the form of data such as computer-readable instructions stored in the memory system. With respect to a computer, a controller, a processing unit, or a processor chip, the expression "configured to" relates to the presence of hardware or a combination of hardware and software which is operable to perform the associated functions.

Many further features and combinations thereof concerning the present improvements will appear to those skilled in the art following a reading of the instant disclosure.

DESCRIPTION OF THE FIGURES

In the figures,

FIG. 7A is a graph showing electron pulse arrival time measured with phase feedback control both off (red) and on (blue);

FIG. 7B is a graph showing correlation between arrival time and cavity power arising from amplitude-phase error in a feedback system of FIG. 4;

FIG. 7C is an histogram of the traces shown in FIG. 7A depicting the long-term stability of time-zero;

FIG. 7D is a graph showing the temporal impulse response function of the electron spectroscopy instrument as a function of phase for a bunch charge of 0.2 pC and cavity power of 44.7 W, where the dashed red line represents the time-resolution of the streak camera.

DETAILED

Figure 1:
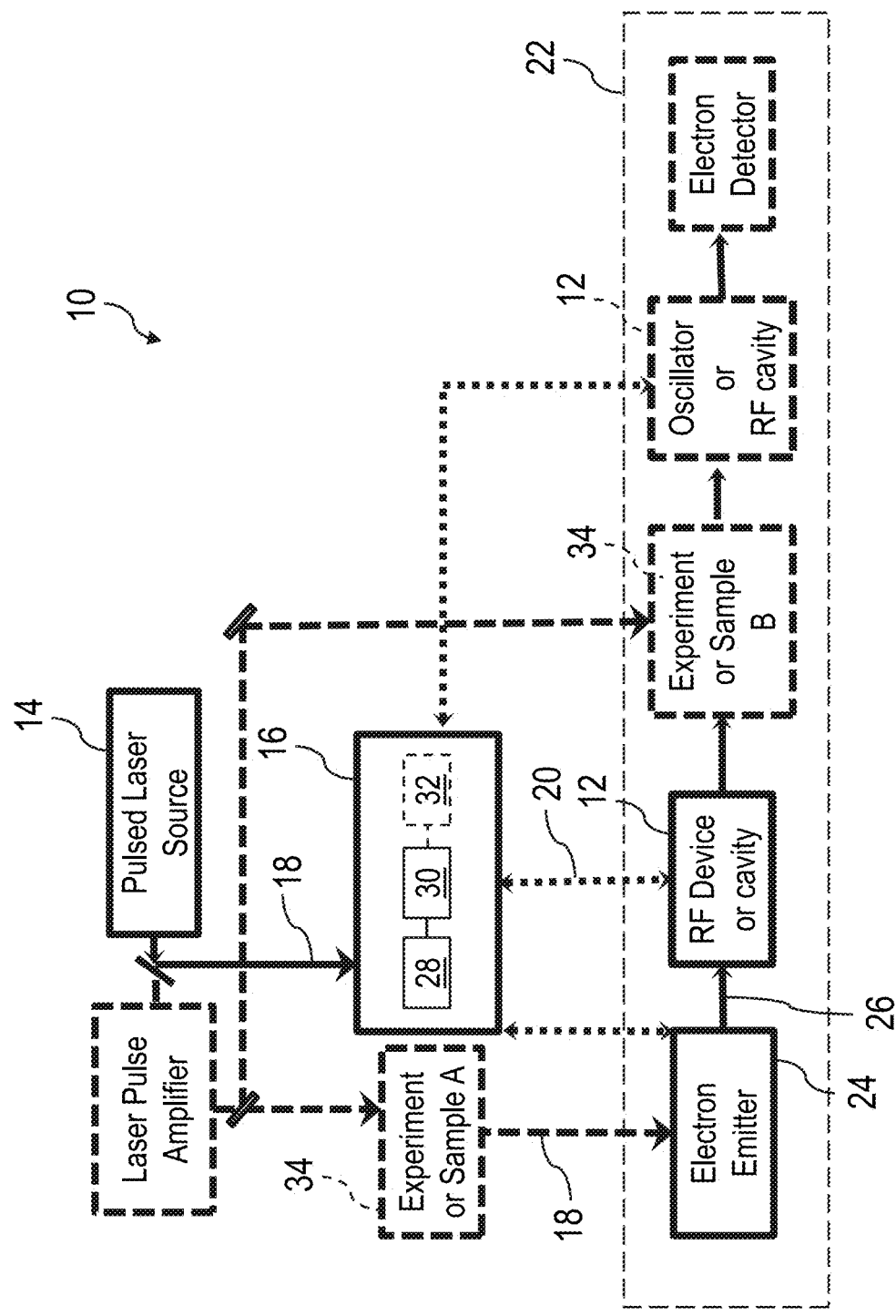
FIG. 1 is a schematic view of a system incorporating a device for generating electromagnetic field oscillation in a RF device or cavity, in accordance with one or more embodiments.

FIG. 1 shows an example of a system 10 generating electromagnetic field oscillation in a RF device or cavity 12. As shown, the system 10 has the RF device or cavity 12, a pulsed laser source 14, and a locking device 16 synchronizing the RF device or cavity 12 to the pulsed laser source 14. As described herein, the locking device 16 receives a laser pulse train 18 having a given repetition frequency from the pulsed laser source 14, and then converts the laser pulse train 18 into an electrical signal 20 having one or more frequencies configured for generating electromagnetic field oscillation in the RF device or cavity 12. For clarity, the solid lines in FIG. 1 represent pulsed electron beam path(s), the dashed lines represent laser pulse train path(s) and the dotted lines represents electrical signal path(s).

In some embodiments, the RF device or cavity 12 can be part of a pulsed electron device 22 that includes the RF device or cavity 12 whose operation requires synchronization with the pulsed laser source 14. Such pulsed electron devices 22 generally have an electron emitter 24 generating accelerated electrons 26 along an electron propagation axis extending across the RF device of cavity 12. The electron emitter 24 can be configured for interacting with at least a portion of the laser pulse train 18 and/or the electrical signal 20 from the locking device 16 and emits the electrons 26 along the propagation axis in response to these interaction(s). In some embodiments, the electron emitter 24 includes a photocathode on which the laser pulse train 18 is incident, thereby generating the electrons 26 via photo emission. The photocathode can have any number of geometries; flat, curved or sharp-tip. However, the electron emitter 24 can differ in at least some other embodiments. Field emission and thermionic emission mechanisms can also be used to generate pulsed electron beams initiated by electrical signals. Examples of such pulsed electron devices can include a streak camera, an electron microscopy instrument, an electron scattering instrument, an electron spectroscopy instrument and/or any other suitable pulsed electron device. The pulsed electron device 22 can have one or more RF device or cavity 12 that can be driven using the same, or different, electrical signal from the locking device 16.

The locking device 16 is configured for receiving at least a portion of the laser pulse train 18 and generating one or more phase-locked microwave signals at harmonics of the laser pulse repetition frequency. As depicted in this example, the locking device 16 has a photo-diode 28 configured for receiving the laser pulse train 18 and emitting a first electrical signal based thereon. The first electrical signal has a plurality of frequencies that are indicative of the laser pulses detected by the photo-diode 28. The locking device 16 also has a harmonics selector 30 configured to output a second electrical signal having one or more frequency of the first electrical signal. The one or more frequency is selected in a manner for the output of the locking device 16, i.e., the electrical signal 20, to generate the electromagnetic field oscillation in the RF device or cavity 12. In some embodiments, the locking device 16 has an amplification train 32 configured to amplify the second electrical signal. However, in some embodiments amplification may not be required at least in some embodiments.

More specifically, the RF device or cavity 12 can be disposed along the electron propagation axis so that it can generate a time-varying electric or magnetic field based on the electrical signal provided by the locking device 16. These electromagnetic fields can modify the emitted electrons by at least one of temporally defocusing, temporally collimating, temporally focusing or deflecting the electrons propagating along the electron propagation axis.

In some embodiments, the system 10 has a phase locking device configured to receive an output of the RF device or cavity 12, detect a change in the phase of the output of the RF device or cavity 12, and apply a phase correction to the RF device or cavity 12 based on the detected phase change. In these embodiments, the detection of the change in the phase of the output of the RF device or cavity 12 can include a step of comparing the output of the RF device or cavity 12 to the output of the locking device 16. This can help the system 10 to maintain a stable operation over long periods of time.

In some embodiments, the system 10 has a sample receiving area 34 that can be downstream from the RF device or cavity 12 and/or upstream from the electron emitter 24. In embodiments where the sample receiving area 34 is downstream from the RF device or cavity 12, the sample is interrogated by the accelerated electrons such as in pulsed electron microscope, diffraction, scattering and/or spectroscopy instruments. In some other embodiments, the sample receiving area 34 can be upstream from the electron emitter 24 such as to be interrogated by the laser pulse train 18. This configuration can be referred to as a "streak camera implementation."

Figure 2:
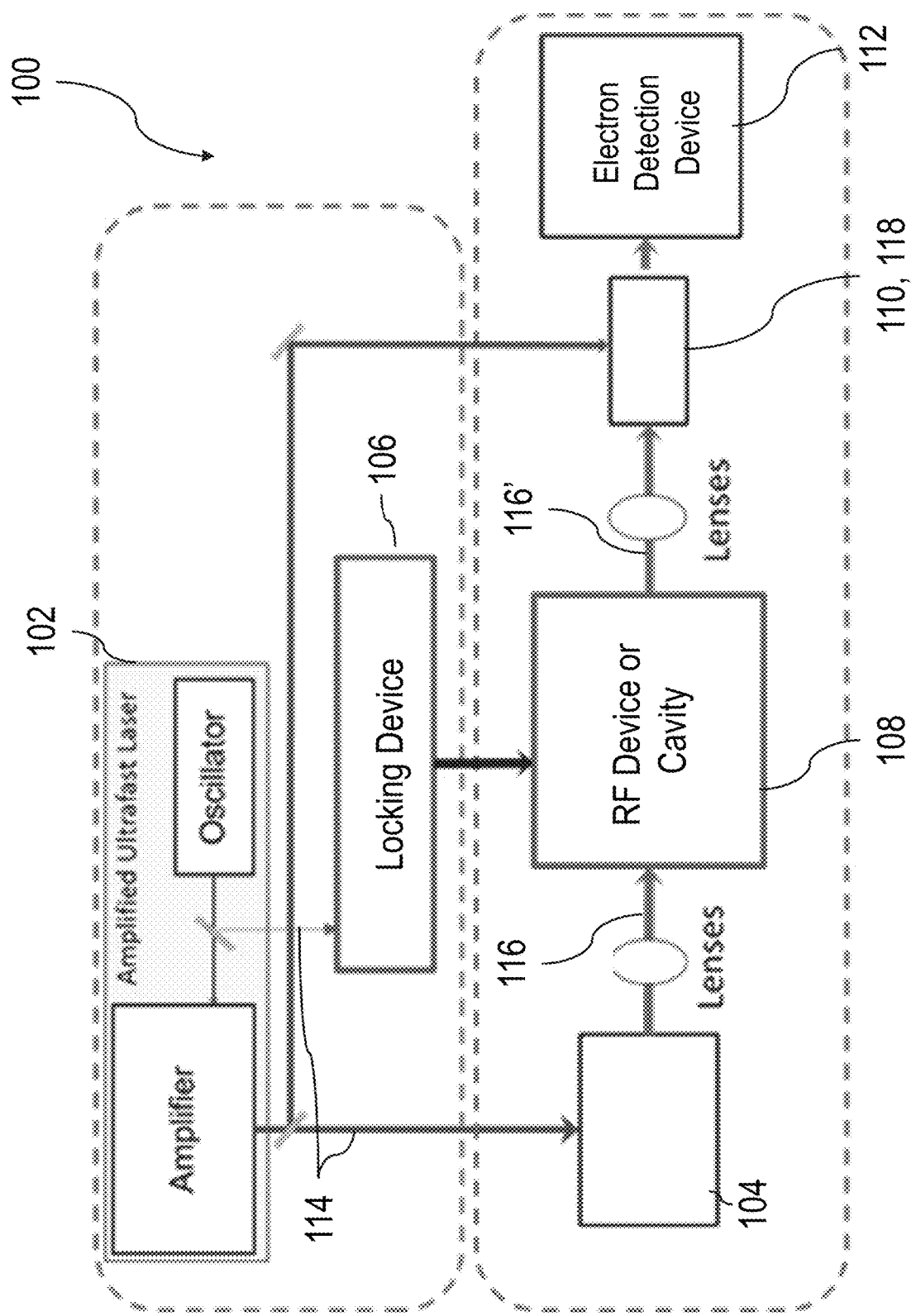
FIG. 2 is a schematic view of an example of an electron spectroscopy system instrument, in accordance with one or more embodiments.

FIG. 2 shows an example of an electron spectroscopy instrument 100. As depicted, the electron spectroscopy instrument 100 has a pulsed laser source 102, an electron emitter 104, a locking device 106, a RF device or cavity 108, a sample receiving area 110 and an electron detection device 112.

More specifically, the pulsed laser source 102 is configured for generating a laser pulse train. The electron emitter 104 is configured for interacting with at least a portion of the laser pulse train 114 and for emitting electrons 116 along an electron propagation axis in response to said interaction. In some embodiments, the electron emitter 104 includes a photocathode on which the laser pulse train 114 is incident, thereby generating the electrons 116 via photo emission. The photocathode can have any number of geometries; flat, curved or sharp-tip. However, the electron emitter can differ in at least some other embodiments. Field emission and thermionic emission mechanisms can also be used to generate pulsed electron beams.

In this embodiment, the locking device 106 is configured for receiving at least a portion of the laser pulse train 114 and to generate a radio frequency signal which is locked on a higher-order harmonic of the laser pulse train 114 used to generate the electrons 116.

The RF device or cavity 108 is disposed across the electron propagation axis so that it can generate an electric field inside the RF device or cavity 108 based on the electrical signal (e.g., a radio frequency signal) received from the locking device 106. The electric field can modify the emitted electrons 116 by at least one of temporally defocusing, temporally collimating and temporally focusing the electrons propagating along the electron propagation axis and across the radio frequency signal.

In this way, when a sample 118 is disposed in the sample receiving area 110, downstream from the RF device or cavity 108 and across the electron propagation axis, the modified electrons 116' can be incident on the sample 118, which can then be received by the electron detection device 112. The electron detection device 112 can produce one or more signals or data being indicative of the interaction between the modified electrons 116' and the sample 118, which in turn can allow characterization of the sample.

In some embodiments, the pulsed laser source can be a pulsed laser source, in which case the laser beam is a pulsed laser beam. For instance, in a specific embodiment, the pulsed laser source is provided in the form of a mode-locked Ti:Sapphire oscillator. However, other solid state lasers, fiber lasers such as erbium-doped fiber lasers, nonlinear optical sources of pulses, any other suitable pulsed laser source can be used.

Figure 3:
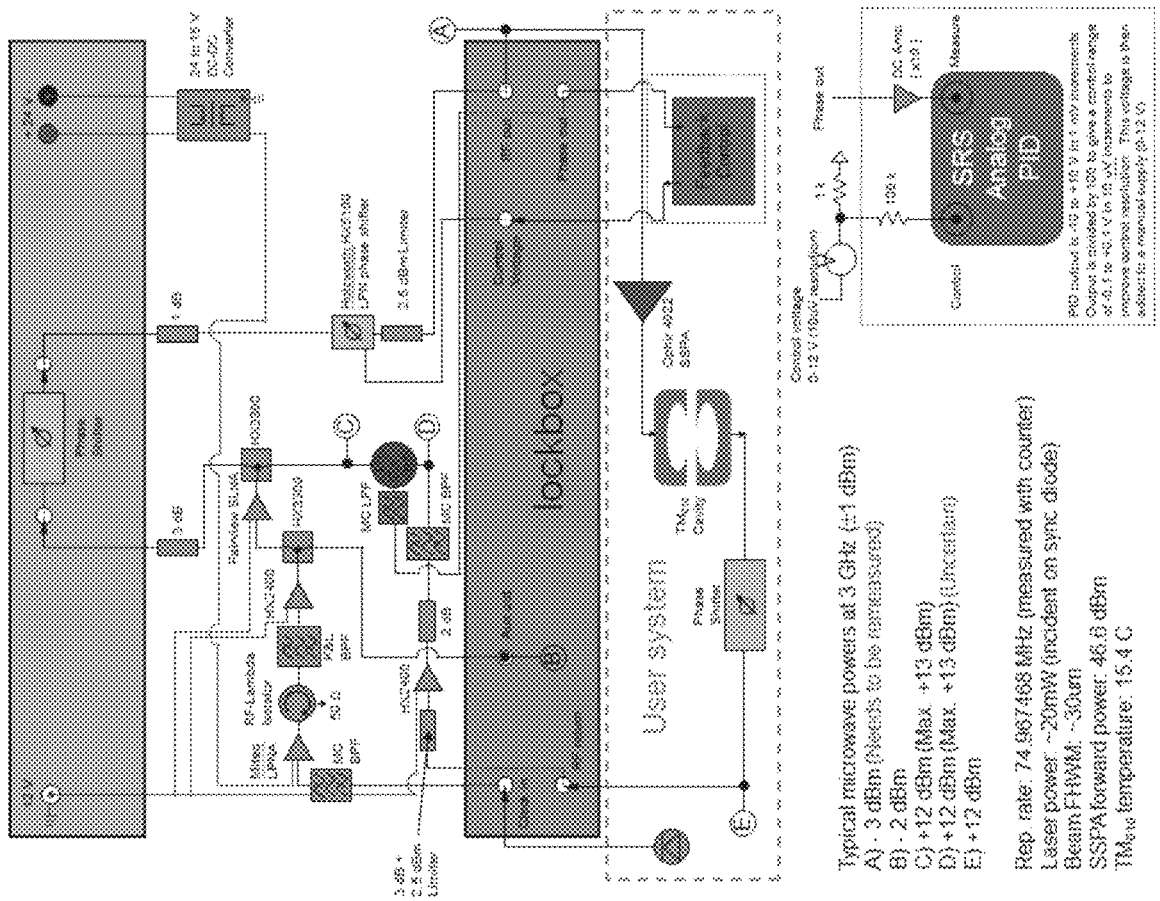
FIG. 3 is a schematic view of an example of a locking device of the electron spectroscopy instrument of FIG. 2, in accordance with one or more embodiments.

More specifically, in this example, the Ti:Sapphire oscillator has a fundamental repetition rate of $f_{rep} \cong 74.98$ MHz. Accordingly, the electron spectroscopy instrument further comprises a fast photodiode with a bandwidth of about 12.5 GHz to sample a portion of the pulsed laser beam and provide a laser pulse train, a first band-pass filter to select the higher-order harmonic in the sampled signal and provide a first filtered signal, an ultra-low phase noise narrow band amplifier providing about roughly 30 dB of gain to amplify the first filtered signal and provide an amplified signal, and a second band-pass filter centered at 2.9985 GHz with a bandwidth of 50 MHz to further isolate the higher-order harmonic in the amplified signal. FIG. 3 shows a detail view of this example. Any photodetector can be used in this implementation provided that its bandwidth is sufficiently high to support the desired harmonic of the laser pulse train.

In some embodiments, the higher-order harmonic of the laser beam ranges between a 20th harmonic and a 60th harmonic of the laser beam. In some other embodiments, the higher-order harmonic of the laser beam preferably ranges between a 30th and a 50th harmonic of the laser beam. Any harmonic can be used as long as its signal to noise ratio is acceptable. However, in this specific embodiment, the higher-order harmonic of the laser beam is a 40th harmonic of the pulsed laser beam generated by the Ti:Sapphire oscillator. A key feature of this embodiment, however, is that the radiofrequency cavity can be chosen to operate at any harmonic of the laser repetition frequency.

Example 1—Solving the Jitter Problem in Microwave Compressed Ultrafast Electron Diffraction Instruments: Robust Sub-50 fs Cavity-Laser Phase Stabilization In this example, there is discussed the compression of electron pulses in a high-brightness ultrafast electron diffraction (UED) or electron spectroscopy instrument using phase-locked microwave signals directly generated from a mode-locked femtosecond oscillator. Additionally, a continuous-wave phase stabilization system that accurately corrects for phase fluctuations arising in the compression cavity from both power amplification and thermal drift induced detuning was designed and implemented. An improvement in the microwave timing stability from 100 fs to 5 fs RMS is measured electronically and the long-term arrival time stability (>10 hours) of the electron pulses improves to below our measurement resolution of 50 fs. These results demonstrate sub-relativistic ultrafast electron diffraction with compressed pulses that is no longer limited by laser-microwave synchronization.

Ultrashort electron pulses are finding diverse applications in research aimed at imaging the dynamic structure of matter. Generation of these pulses normally starts with photoemission driven by a femtosecond laser pulse at a photocathode, after which Coulomb repulsion internal to the photo emitted bunch takes hold (space-charge) broadening both the temporal duration and energy distribution. Unmodified by external fields, these space-charge dynamics result in a trade-off between pulse fluence and time resolution that is detrimental to ultrafast electron diffraction and imaging experiments. As a result, there have been a number of efforts to correct such broadening through the addition of electron pulse compression strategies that employ microwave, terahertz and DC electric fields. These approaches work by inverting the space-charge driven expansion that occurs naturally in the pulse, leading to a temporal focus downstream from the pulse-field interaction. Microwave compression in particular has been demonstrated to be very effective in the single shot limit, yielding electron pulses below 100 fs at 100 keV and very recently sub-10 fs at 7 MeV that contain more than $10^5$ electrons. Unfortunately, the stability of the cavity-laser synchronization systems that have been employed to date have been insufficient to provide pulse duration limited time-resolution in ultrafast electron diffraction instruments over longer data acquisition times (several hours). Published reports have all concluded that time-resolution in microwave compressed instruments has been closer to 400 fs due to "time-zero" drift that results from various cavity-laser phase synchronization instabilities that are evident in the frequency range from kHz to Hz. As a result of these drifts, the primary benefit of microwave pulse compression to date and been an increase in bunch charge rather than a dramatic improvement in time resolution.

For UED pump-probe experiments, synchronizing the laser system with a microwave signal has been previously achieved by phase-locking loops (PLL) using external voltage-controlled oscillators, or repetition rate multiplication techniques which involve optical enhancement cavities. Both approaches involve the derivation of a locked harmonic in the GHz range with sufficient spectral power and sufficiently low phase noise. Timing and frequency stability is fundamentally limited by amplitude-phase conversion inherent to the photo detection process and depends on the pulse energy stability of the laser. For the case of the phase-locked loop, amplitude-phase conversion also manifests in microwave mixers when comparing two signals, yielding phase errors produced by power fluctuations. For UED synchronization systems to date, the focus has been primarily on the frequency range above 1 Hz, with minimal consideration of drift on timescales up to several hours, which are of particular relevance for experiments. Such drifts cause t=0 to change over the course of many pump-probe delay scans and arise most significantly in sensitive elements such as the compression cavity and power amplification which are typically omitted from the synchronization configuration. In this example, we demonstrate stable, passive generation of a 3 GHz signal by direct photodetection of the laser pulse train and its use for compression of electron pulses in a 100 keV in a high-brightness ($10^6$ e$^-$/pulse) ultrafast electron diffraction instrument. We also present an all-microwave active synchronization enhancement system which measures and compensates for phase fluctuations arising in the compression system. We measure greater than a ten-fold improvement in laser-microwave synchronization quality by directly measuring phase changes of the cavity field using an integrated antenna. We further demonstrate, using a streak camera, that the phase stabilization system improves the long-term stability of the pulse arrival time and the temporal impulse response function of the UED instrument by correcting for phase over a very broad low-frequency band. This improved performance is due to the elimination of several sources of phase instability inherent in previous approaches; i) amplitude phase errors in PLL generation of microwave signal, ii) Phase instability in power amplification iii) Phase drift in the cavity response due to thermal induced frequency detuning.

Figure 4:
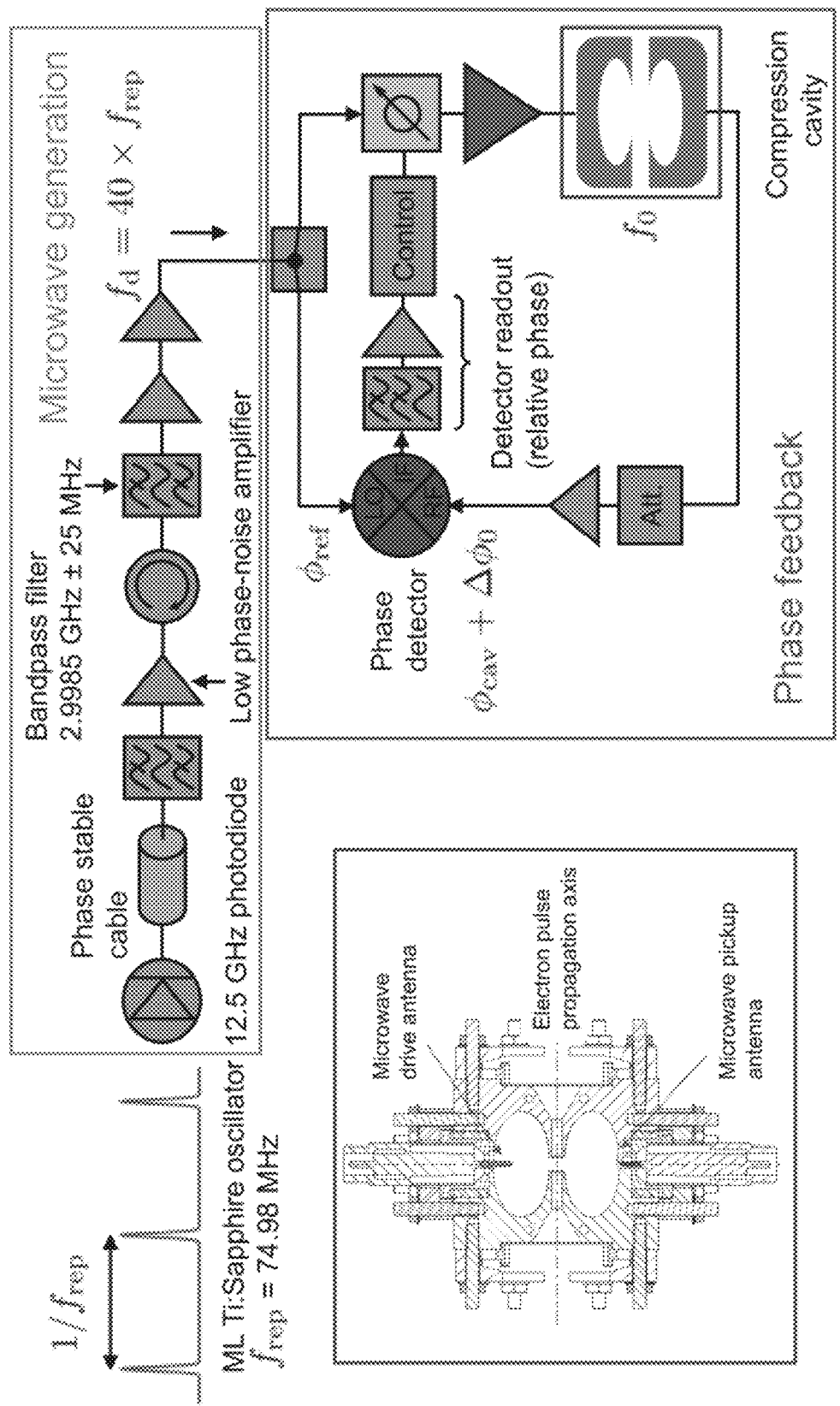
FIG. 4 is a schematic view of another example of a locking device of the electron spectroscopy instrument of FIG. 2, showing a pulsed laser beam directed to a photocathode and a RF device or cavity, in accordance with one or more embodiments.

The master clock of the instrument used in this work is a mode-locked Ti:Sapphire oscillator with a fundamental repetition rate of $f_{rep} \cong 74.98$ MHz. A synchronized microwave signal is generated by sampling a portion of the oscillator laser output using a fast photo-diode (Newport 818-BB-45) with a bandwidth of 12.5 GHz (FIG. 4). This signal is filtered by a coarse band-pass filter (Mini-Circuits VBF-2900+) to select the relevant harmonic ($f_d=40 \times f_{rep}$) and sent to an ultra-low phase noise narrow band amplifier (Miteq AMF-2F-LPN) providing roughly 30 dB of gain. The amplified output filtered by a cavity band-pass filter centered at 2.9985 GHz with a bandwidth of 50 MHz to further isolate the desired harmonic signal. Reflected signals from harmonics outside the pass-band are isolated and dumped to a 50Ω load to maintain directivity of the signal generation circuit. The signal is amplified by a low phase noise amplifier (Holzworth HX2400) and then a saturated low noise amplifier (Fairview SLNA-060-40-09) in order to achieve optimal power stability. The signal is then split into two paths. The first path is continuous-wave amplified to high-power (typically 46-48 dBm) and used to drive the microwave electron pulse compression cavity (see FIG. 4) which has a TM$_{010}$ resonant mode of $f_0=2.9985$ GHz at 19° C., an unloaded quality factor of $Q \cong 1.2 \times 10^4$ and a bandwidth of lta≈250 kHz. In order to improve the synchronization quality of the instrument, we must account for phase changes produced by elements in this first signal path relative to those in the second, which we will consider to be our stable phase reference.

More specifically, FIG. 4 shows direct generation of synchronized microwaves and active phase stabilization for electron pulse compression. A portion of the output of a mode-locked Ti:Sapphire oscillator ($f_{rep} \approx 74.98$ MHz) is incident on a high-bandwidth (12.5 GHz) GaAs photodiode. The $40^{th}$ harmonic is generated by filtering using narrow bandpass filters and ultra-low phase noise microwave amplifiers. The power of the synchronized drive signal $f_d = 40 \times f_{rep} \approx 2.9985$ GHz is roughly +16 dBm after passing through the final amplifier operated in saturation. The signal is split and the first serves as a reference signal carrying a phase $\phi_{ref}$ and is fed to the local oscillator (LO) port of a phase detector. The second signal is amplified by a CW solid-state power amplifier and drives the resonant cavity for electron pulse compression. An antenna integrated into the cavity retrieves the phase $\phi_{cav} + \Delta\phi_0$ by coupling directly to the electric field and produces an output signal which is attenuated and amplified to reach a power identical to that of the reference signal before coupling to the second input (RF) of the phase detector. The feedback system maintains a constant value of $\phi_{ref} - \phi_{cav}$ by shifting the phase of $\phi_{cav}$ in order to eliminate fluctuations $\Delta\phi_0$.

Figure 5B:
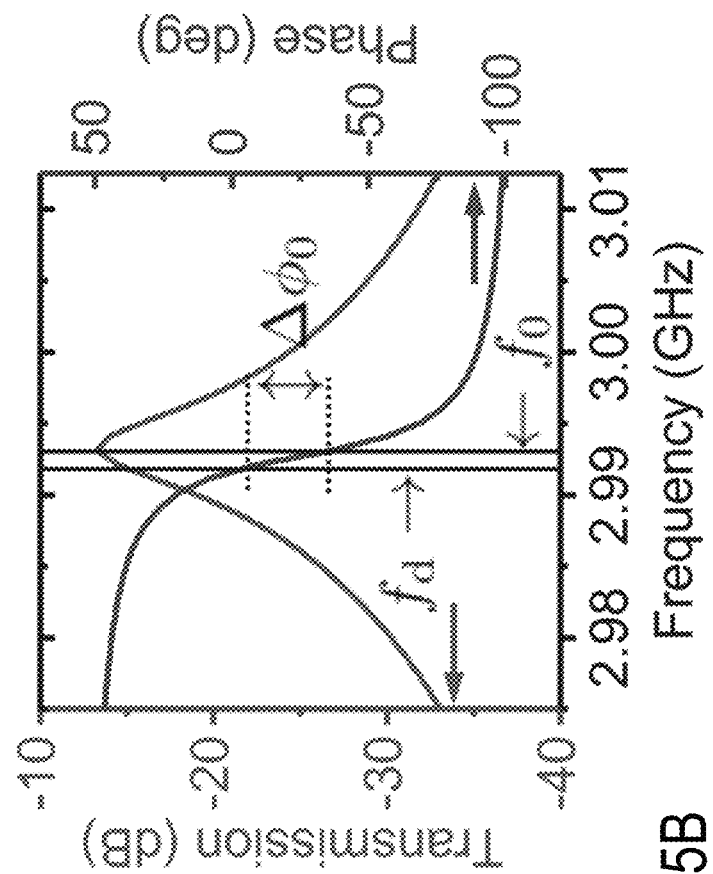
FIG. 5B is a graph showing a simulation of the amplitude and phase of the $S_{21}(f)$ transmission function for the ~3 GHz microwave RF device or cavity of FIG. 4, showing detuning between the drive frequency $f_0$ and cavity resonance $f_d$ lead to a phase shift $\Delta\phi_0$ of the cavity field.
Figure 5A:
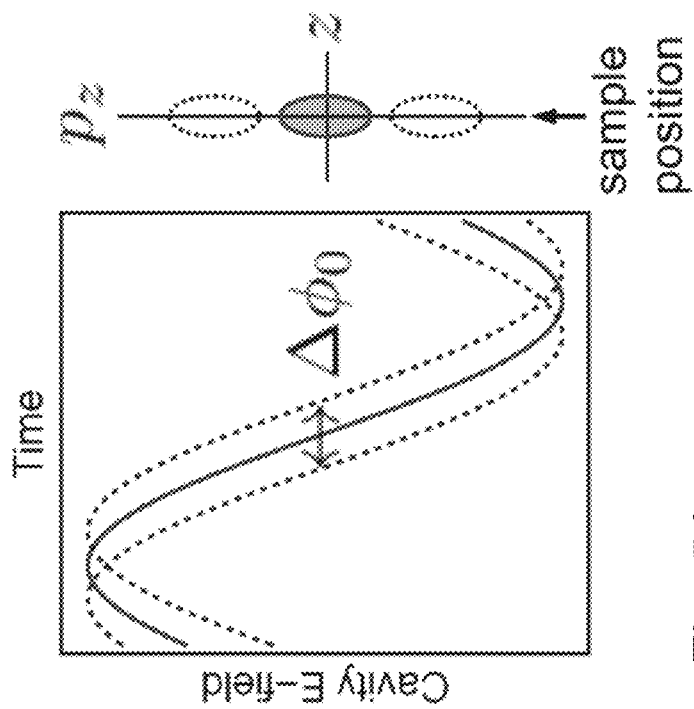
FIG. 5A is a graph showing the effect of phase instabilities, showing changes in phase $\Delta\phi_0$ of the electric field oscillation in the RF device or cavity of FIG. 4 relative to the arrival of an electron pulse cause a change in momentum transfer to the compressed pulse $\Delta p_z$.

We will now discuss more precisely the nature of the phase instabilities we address in this example. At optimal pulse compression timing, the phase of the drive signal $\phi_0$ is such that electrons at the center of the dispersed pulse arrive during when electric field oscillation in the cavity is $E(t)=0$. This is achieved by varying the phase of the signal before high-power amplification. The momentum transferred to an electron pulse by an electric field $E(t) = E_0^z \exp(-i\omega_d t + hi_0)$ is given by:

$$p_z = eE_0^z \int \exp(-i\omega_d t + \phi_0) dt, \quad (1)$$

where $E_0^z$ is the cavity field along the propagation axis of the electron pulse, $\omega_d = 2\pi f_d$ and the integral spans the time during which an electron pulse interacts the cavity field. By Eqn. (1), phase fluctuations, which we denote as $\Delta\phi_0$, cause variations in the average momentum transferred to electrons in the pulse $\Delta p_z$ (see FIG. 5A) and consequently yield a change in the arrival time at the temporal focus of the cavity given by $\Delta t = -\Delta\phi_0/\omega_d$. External phase fluctuations arise primarily from two sources. The first is phase instabilities caused by high-power amplification which we write as $\Delta\phi_0^A$. The second source of phase drift arises from frequency detuning between the cavity resonance and the drive signal, $\omega_d - \omega_0$. This leads to changes in the microwave transmission properties of the cavity (see FIG. 4B). In the vicinity of resonance ($\Delta\omega < \delta$), detuning produces a corresponding phase change in the cavity given by:

$$\Delta\phi_0^d = 2Q \frac{\omega_d - \omega_0}{\omega_0}. \quad (2)$$

Clearly, both $\omega_d$ and $\omega_0$ impact Eqn. (2) and can vary independently. $\omega_d$ is determined by the value of the oscillator repetition rate and thus variations on the order of 0.1-1 kHz are expected on timescales on the order of days. The cavity resonance is sensitively a function of temperature, for which changes in the range of a few mK yield variations in $\omega_0$ also on the order of 0.1-1 kHz. These sources of detuning yield timing changes in excess of $\Delta t = \Delta\phi_0^d/\omega_d > 100$ fs. We write the total arrival time drift due to both sources of phase fluctuations as $$\Delta t = -\frac{1}{\omega_d}(\Delta\phi_0^A + \Delta\phi_0^d)$$

which has the effect of shifting the pump-probe delay (time-zero) during the course of an experiment, thus degrading the temporal resolution of the instrument. It is therefore critical to accurately sample the electric field and phase changes occurring in the resonant cavity to determine the relevant timing fluctuations impacting electron pulses in a UED instrument.

Detection of phase changes is achieved by measuring the signal transmitted through the cavity using an integrated pick-up antenna (see FIG. 4) which retrieves the electric field inside the cavity. The collected signal is attenuated and passed through a saturated low-phase noise amplifier (Holzworth HX2400) to maintain a stable power of +12.0 dBm. This signal is then sent to a phase detector (Holzworth HX3400). The detector compares the phase of this signal (RF), $\phi_{cav}$, with the phase of the pre-compression reference signal (LO), $\phi_{ref}$. Since both signals have the same frequency $f_d$, the detector produces a DC voltage proportional the phase difference between the two signals $V_\phi^0 = \kappa_{textupdet}(\phi_{ref} - \phi_{cav})$. $\kappa_{det} = 320$ mV/rad is the phase detector constant determined via calibration. Due to the character of the phase response shown in FIG. 5B) we assume that $\Delta\phi_0$ arises dominantly from the compression cavity with secondary high-frequency components from the solid-state power amplifier, therefore, $\phi_{cav} \to \phi_{cav} + \Delta\phi_0$ and $V_\phi = V_\phi^0 + \Delta V$. The changes in detector output voltage $\Delta V$ allow for phase drift to be monitored with respect to the initial starting value $V_\phi^0$ (i.e. optimal compression settings). Information from the phase detector signal may also be used to correct for phase drifts by precisely shifting the phase of the microwave drive signal. This ensures that phase changes relative to the initial set-point value are minimized. We implement this using a low-noise fully analog microwave phase shifter (Analog Devices HMC928LP5E). The phase detector output voltage is amplified by a factor of 10 to optimize the detection resolution of a fully analog PID controller (Stanford Research Systems SIM 960) which has an operating bandwidth of 1 kHz. A schematic of the active phase feedback system is illustrated in FIG. 4.

Figure 6A:
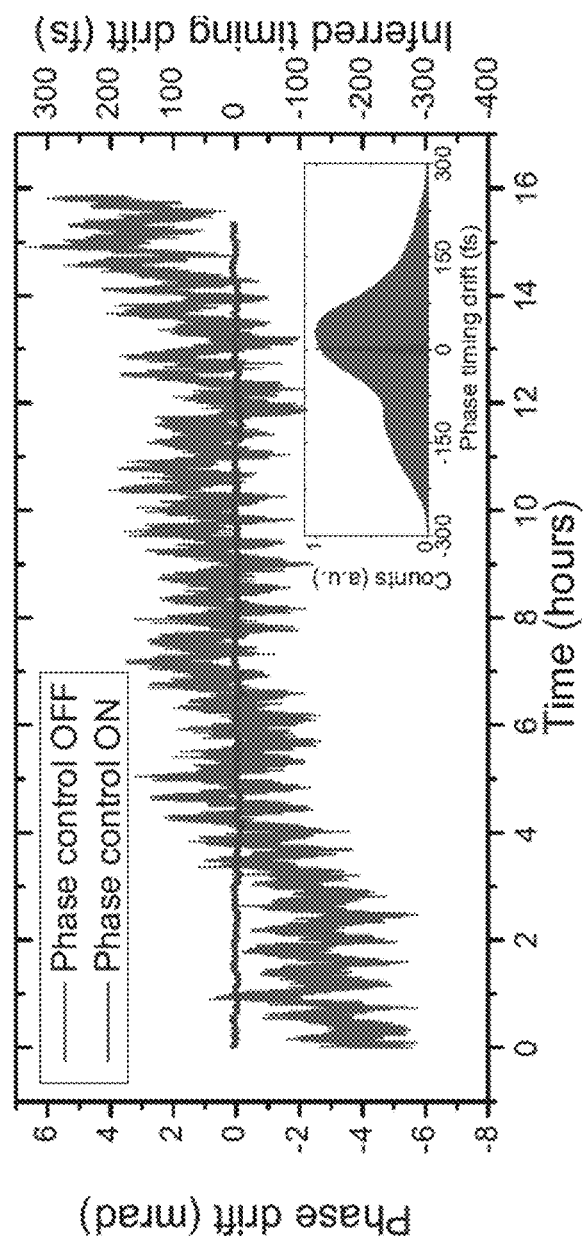
FIG. 6A is a graph showing electronic phase timing measurement of a detection system of FIG. 4, where data for feedback off (red) and on (blue) are compared over the course of several hours and histograms of the phase distribution are shown in the inset.
Figure 6B:
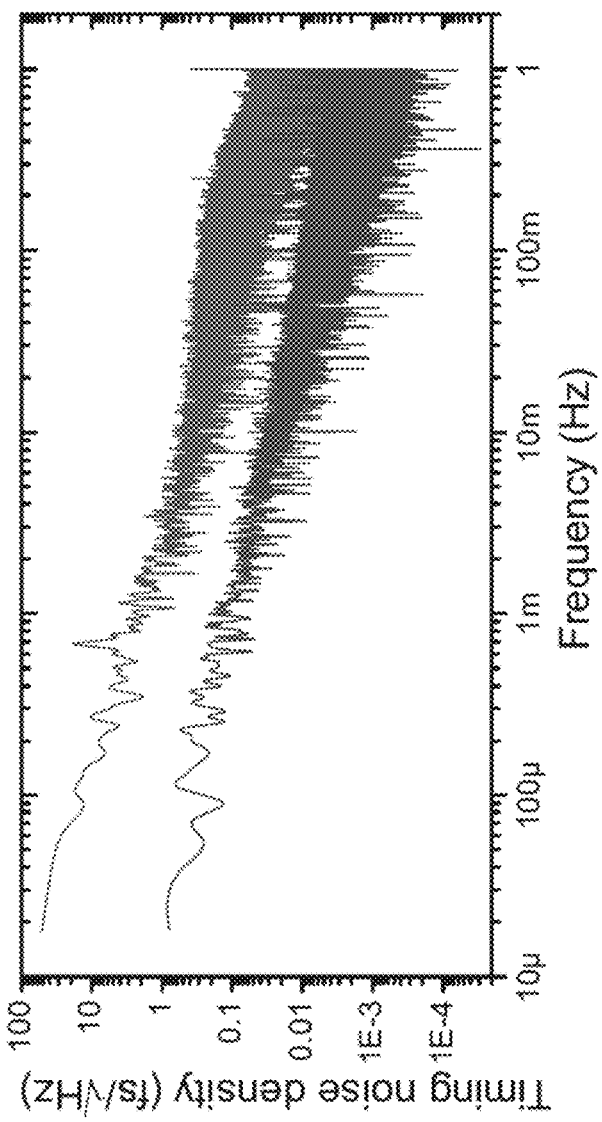
FIG. 6B is a graph showing additive timing noise power spectral density of the data shown in FIG. 6A.

We characterize the improvement of the instrument by measuring the detector output voltage over the duration of a typical experiment (several hours). The output voltage is converted to phase and timing drift using $\kappa_{det}$ and the drive frequency $\omega_d$. A comparison with the feedback and control on and off is presented in FIG. 6A. Without feedback, detuning instabilities produce synchronization drift on the order of hundreds of fs (see FIG. 6A). With feedback, we see a significant improvement for which the synchronization drift below is 5 fs RMS. The phase stabilization system reduces the power spectral density of the timing noise (relative to the signal pre-amplification) by over an order of magnitude across 5 low-frequency decades, as seen in FIG. 6B. Both low-frequency thermal detuning drifts in the cavity and mid-frequency jitter are continuously corrected over long timescales.

We also directly measure the change in the arrival time of the electron pulses with respect to a femtosecond optical pump pulse using an optically triggered 10 GHz streak camera. By tracking the center of the streaked electron pulse on a CCD camera, we may quantify timing drifts in a manner which replicates a typical pump-probe UED experiment up to the limits imposed by the streak camera itself. We operate at a laser amplifier repetition rate of 1 kHz and a CCD exposure time of 1 s. The streaked electron pulse it fit to a 2D Gaussian function to accurately determine the center position. A relationship between the streaked pulse position and time depends on the geometry of instrument and also the circuit properties of the streak camera. A calibration measurement was performed and a streak velocity of $v_s=84$ m/ps was determined. The streak camera itself has a finite temporal resolution which we determine to be $\tau_s \approx 50$ fs RMS using the statistics of an unstreaked electron pulse and the pulse spot size. A comparison of the electron pulse arrival time stability with and without feedback control is shown in FIGS. 7A and 7C. We find a significant improvement in the arrival time stability to better than $\Delta t=50$ fs over the duration of many hours. This result is a significant improvement for high-brightness multi-shot ultrafast electron diffraction systems implementing microwave pulse compression. The remaining temporal drift may be explained in terms of feedback over-correction due to amplitude-phase conversion arising in the phase detector. Amplitude fluctuations lead to changes in DC voltage which cannot be differentiated by the analog feedback control system. We determine an amplitude coefficient −54 mV/dBm by varying the power of the RF (compression cavity) signal. When converted to phase using the phase detector constant, $\kappa_{det}$, we have a phase error coefficient of −0.17 rad/dBm. Amplifier drift on the order of ±0.02 dBm will yield a phase timing changes of roughly 180 fs which explains correlation between arrival time drift and cavity power depicted in FIG. 7B. This effect could potentially be minimized by using limiters and/or microwave power stabilization hardware. For the case where sufficient power amplifier stability may not be achieved, the phase detection system may be used passively (no feedback control) to log phase drift, the amplitude converted portion of the detector signal may be easily removed by measuring power, and a time-stamping procedure can be performed.

Finally we characterize the temporal impulse response function (IRF) of the instrument. The temporal RMS pulse duration $\tau_e$ of the electron pulse is given by the deconvolution of a reference (unstreaked) electron spot and streaked spot. This is written as $\tau_e = v_s^{-1} \sqrt{\sigma_{ref}^2 - \sigma_s^2}$, where $\sigma_{ref}$ and $\sigma_s$ are determined from fitting the unstreaked and streaked electron spot respectively to a 2D Gaussian function. The streak velocity $v_s=84$ m/ps was determined by a measurement of the streak field ring-down. Pulse images are taken as a function of cavity phase and $\sigma_{ref}$ and $\sigma_s$ are determined for each acquisition. The impulse response function is determined for a pulse charge of 0.2 pC and a forward power of 44.7 W. At each phase value, 30 pictures at 1 s exposure and 1 kHz repetition rate time are collected and the average values $\langle\sigma_{ref}\rangle$ and $\langle\sigma_s\rangle$ are determined. The averages reflect $3\times10^4$ individual electron pulses are limited by jitter faster than the 1 s CCD integration time. The IRF as a function of phase is shown in FIG. 7D. We find that the IRF approaches 50 fs for optimal power and phase, at which point the measurement is limited by the temporal resolution of the streak camera. We measure an upper limit IRF of $\tau_e=45\pm2$ fs (106 fs full-width at half-maximum). We note that this is an improvement by over a factor of 3 when compared to previously reported instrument performance. We attribute this enhancement in performance to the direct generation of phase-locked microwaves, the use of stable continuous-wave high-power microwave amplification in conjunction with active phase stabilization. The total temporal impulse response function $\tau$, is given by $\tau = \sqrt{\tau_e^2 + \Delta t^2}$. Including long-term drift shown in FIG. 7C of Deltat=50 fs, yielding $\tau \approx 68$ fs. To the best of our knowledge, this is the lowest measured temporal impulse response function for a high-brightness, multi-shot, sub-relativistic ultrafast electron diffraction instrument.

In conclusion, we have achieved ultrafast electron diffraction with pulse compression using phase-locked microwaves synthesized directly from a mode-locked oscillator. Furthermore, we have designed and characterized a high-performance integrated microwave phase feedback system which compensates for detuning induced phase fluctuations in compression cavities improving the laser-microwave synchronization level by a factor of 10 to below 5 fs RMS. The long-term arrival time stability of the electron pulse is also improved from >200 fs to <50 fs RMS with phase stabilization. The impulse response function of the instrument is measured to be less than 70 fs RMS over many hours. Our results illustrate that high-brightness UED instruments can be realized in a simpler approach and pushed to a regime where time-resolution is limited by the duration of the compressed electron pulse, not synchronization quality.

Figure 8:
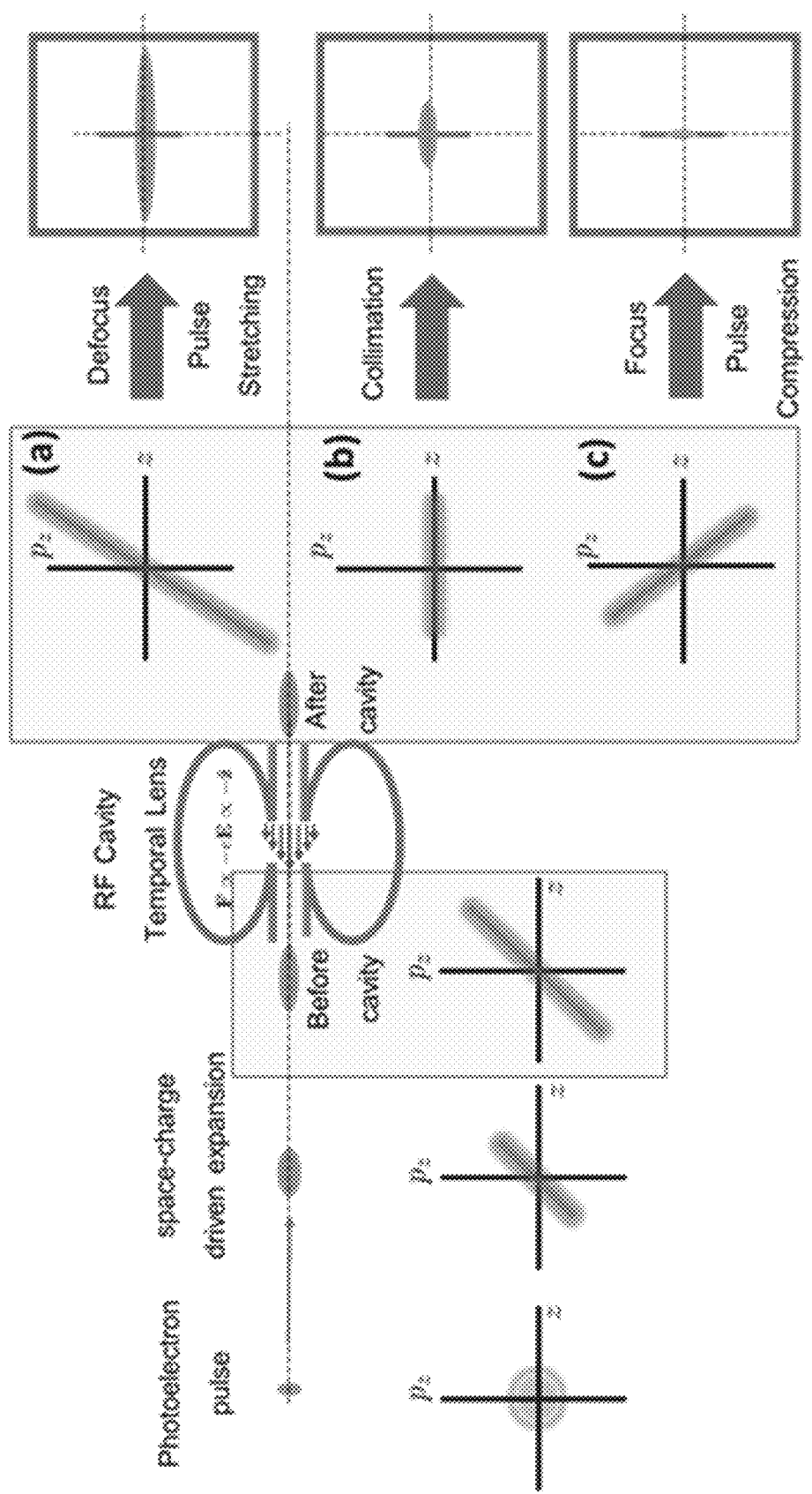
FIG. 8 is a schematic view of an example of a RF device or cavity and its operation on a pulsed electron beam, showing that a RF device or cavity operating in the $TM_{010}$ mode can defocus, collimate and focus electrons depending on the radio frequency signal with which the RF device or cavity is operated.

FIG. 8 shows the RF device or cavity across which electrons are propagated. More specifically, there is shown graph showing the temporal distribution of the electrons of a bunch depending on how the RF device or cavity is operated.

As can be understood, the examples described above and illustrated are intended to be exemplary only. For instance, RF cavities operating in other modes can have other effects on the electron beam; e.g. the $TM_{110}$ mode can be used to deflect an electron beam. It is intended that the devices and systems described herein can be used in various applications including, but not limited to, e-beam manipulations, optical pulse shaping, optical pulse modulation, laser array synchronization, radio array synchronization, two dimensional spectroscopy, time resolved electron microscopy, street cameras, electro-optic modulator and particle accelerators. In some embodiments, the locking device has a rigged photo-diode which receives the laser pulse train, converts it into an electrical signal while removing the unwanted frequencies. In such embodiments, the rigged photo-diode would perform both detection and filtering, thereby rendering optional the use of an additional harmonics selector, as the harmonics selector is indeed embedded in the rigged photo-diode. The scope is indicated by the appended claims.

What is claimed is:

1. A device for generating microwave electromagnetic field oscillation in a microwave device or cavity, the device comprising:
   a photo-diode configured for receiving a laser pulse train and emitting a first electrical signal based thereon, the first electrical signal having a plurality of frequencies;
   a harmonics selector configured to output a second electrical signal having one or more frequency of the first electrical signal, the one or more frequency being selected in a manner for the output to drive the microwave electromagnetic field oscillation in the microwave device or cavity; and
   an amplification train configured to amplify the second electrical signal.

2. The device of claim 1 further comprising a sample receiving area downstream from said microwave device or cavity and across which an electron propagation axis extends.

3. The device of claim 1 wherein the photo-diode is a fast photodiode with a bandwidth of about 12.5 GHz to sample a portion of the laser pulse train and provide the first electrical signal.

4. The device of claim 1 wherein the harmonics selector has a first band-pass filter to select a higher-order harmonic and provide the first electrical signal, an ultra-low phase noise narrow band amplifier providing about roughly 30 dB of gain to amplify the first electrical signal and provide an amplified signal, and a second band-pass filter centered at 2.9985 GHz with a bandwidth of 50 MHz to further isolate the higher-order harmonic in the amplified signal.

5. The device of claim 4 wherein the higher-order harmonic ranges between a 20th harmonic and a 60th harmonic of the laser beam.

6. The device of claim 4 wherein the higher-order harmonic preferably ranges between a 30th and a 50th harmonic of the laser beam.

7. The device of claim 4 wherein the higher-order harmonic most preferably is a 40th harmonic of the laser beam.

8. A system comprising:
a microwave device or cavity;
a pulsed laser source;
a locking device configured to receive a laser pulse train from the pulsed laser source, and to convert the laser pulse train into an electrical signal having one or more frequencies configured for driving microwave electromagnetic field oscillation in the microwave device or cavity; and
an amplification train configured to amplify the second electrical signal.

9. The system of claim 8 wherein the microwave device or cavity is part of a pulsed electron device.

10. The system of claim 8 further comprising a phase locking device configured to receive an output of the microwave device or cavity, detect a change in the phase of the output of the microwave device or cavity, and apply a phase correction to the microwave device or cavity based on the detected phase change.

11. The system of claim 10 wherein detecting a change includes comparing the output of the microwave device or cavity to the output of the locking device.

12. The system of claim 8 further comprising a sample receiving area downstream from said microwave device or cavity and across which an electron propagation axis extends.

13. The system of claim 12 wherein the microwave device or cavity is configured to at least one of temporally defocus, temporally collimate and temporally focus and deflect electrons propagated along the electron propagation axis.

14. The system of claim 8 wherein the pulsed laser source is a mode-locked Ti:Sapphire oscillator.

15. The system of claim 14 wherein the Ti:Sapphire oscillator has a fundamental repetition rate of $f_{rep} \cong 74.98$ MHz.

16. The system of claim 8 wherein the locking device has a photo-diode configured for receiving the laser pulse train and emitting a first electrical signal based thereon, the first electrical signal having a plurality of frequencies; and a harmonics selector configured to output a second electrical signal having one or more frequency of the first electrical signal, the one or more frequency being selected in a manner for the output to drive the microwave electromagnetic field oscillation in the microwave device or cavity.

17. The system of claim 16 wherein the photo-diode is a fast photodiode with a bandwidth of about 12.5 GHz to sample a portion of the laser pulse train and provide the first electrical signal.

18. The system of claim 16 wherein the harmonics selector has a first band-pass filter to select a higher-order harmonic and provide the first electrical signal, an ultra-low phase noise narrow band amplifier providing about 30 dB of gain to amplify the first electrical signal and provide an amplified signal, and a second band-pass filter centered at 2.9985 GHz with a bandwidth of 50 MHz to further isolate the higher-order harmonic in the amplified signal.

19. A device for generating microwave electromagnetic field oscillation in a microwave device or cavity, the device comprising:
a photo-diode configured for receiving a laser pulse train and emitting a first electrical signal based thereon, the first electrical signal having a plurality of frequencies;
a harmonics selector configured to output a second electrical signal having one or more frequency of the first electrical signal, the one or more frequency being selected in a manner for the output to drive the microwave electromagnetic field oscillation in the microwave device or cavity; and
a sample receiving area downstream from said microwave device or cavity and across which an electron propagation axis extends.

20. The device of claim 19 wherein the microwave device or cavity is configured to at least one of temporally defocus, temporally collimate, temporally focus and deflect electrons propagated along the electron propagation axis.

* * * * *